(12) United States Patent
Bartholomäus

(10) Patent No.: US 7,091,547 B2
(45) Date of Patent: Aug. 15, 2006

(54) SEMICONDUCTOR STORAGE LOCATION

(75) Inventor: Lars Bartholomäus, Dresden (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/478,681

(22) PCT Filed: May 8, 2002

(86) PCT No.: PCT/DE02/01671

§ 371 (c)(1),
(2), (4) Date: Dec. 5, 2003

(87) PCT Pub. No.: WO02/099813

PCT Pub. Date: Dec. 12, 2002

(65) Prior Publication Data

US 2004/0169215 A1 Sep. 2, 2004

(30) Foreign Application Priority Data

Jun. 6, 2001 (DE) ................................ 101 27 336

(51) Int. Cl.
*H01L 27/108* (2006.01)
(52) U.S. Cl. ...................... 257/310; 257/300; 257/296; 257/301; 257/E27.084
(58) Field of Classification Search ................ 257/296, 257/306, 310, 300, 301, 303, 304, E27.084
See application file for complete search history.

(56) References Cited

U.S. PATENT DOCUMENTS

| | | | | |
|---|---|---|---|---|
| 3,375,420 A | * | 3/1968 | Sher et al. ................... | 361/312 |
| 4,084,101 A | | 4/1978 | Sher | |
| 4,152,597 A | * | 5/1979 | Sher ....................... | 250/370.01 |
| 4,213,797 A | * | 7/1980 | Sher ........................... | 136/254 |
| 4,761,385 A | * | 8/1988 | Pfiester ........................ | 438/386 |
| 4,855,953 A | | 8/1989 | Tsukamoto et al. | |
| 4,864,462 A | | 9/1989 | Madou et al. | |
| 4,906,590 A | * | 3/1990 | Kanetaki et al. ............. | 438/386 |
| 4,956,692 A | * | 9/1990 | Ozaki et al. ................. | 257/506 |
| 5,027,172 A | * | 6/1991 | Jeon ........................... | 257/303 |
| 5,185,284 A | * | 2/1993 | Motonami .................. | 438/244 |
| 5,310,696 A | | 5/1994 | McCann et al. | |
| 5,411,911 A | * | 5/1995 | Ikeda et al. ................. | 438/246 |
| 5,555,520 A | * | 9/1996 | Sudo et al. .................. | 365/149 |
| 5,701,022 A | * | 12/1997 | Kellner et al. .............. | 257/300 |
| 5,867,420 A | | 2/1999 | Alsmeier | |
| 5,920,785 A | * | 7/1999 | Chi et al. .................... | 438/387 |
| 5,959,326 A | * | 9/1999 | Aiso et al. .................. | 257/306 |
| 5,981,332 A | * | 11/1999 | Mandelman et al. ....... | 438/246 |

OTHER PUBLICATIONS

Gabusjan et al. "Improved Ion-Conducting Layer Replacing the Insulator in a Capacitive Chemical Semiconductor Sensor" 199 p. 263-273, vol. 10, No. 5.*

(Continued)

*Primary Examiner*—Eugene Lee
(74) *Attorney, Agent, or Firm*—Edell, Shapiro & Finnan, LLC

(57) ABSTRACT

A semiconductor memory cell, in particular, in a DRAM memory cell array, includes a selection transistor and a storage capacitor. The storage capacitor has a first and a second capacitor electrodes. The first capacitor electrode is connected to a read-out line via the selection transistor. A control terminal of the selection transistor is connected to a control line. A layer of a superionic conductor is arranged between the first and second capacitor electrodes of the storage capacitor. The high conductivity of the superionic conductor for ions in association with a negligible electron conductivity allows extremely high capacitances to be produced in a small space.

8 Claims, 1 Drawing Sheet

OTHER PUBLICATIONS

Tigran Gabusjan, Lars Bartholomaus and Werner Moritz, *Improved Ion-Conducting Layer Replacing the Insulator in a Capacitive Chemical Semiconductor Sensor*, Sensors and Materials, 1998, pp. 263-273, vol. 10, No. 5, Humboldt-University Berlin, Walther-Nernst-Institut of Physical and Theoretical Chemistry, Berlin, Germany.

George Thieme Verlag, Lonenleiter, 1995, 2 pages.

* cited by examiner

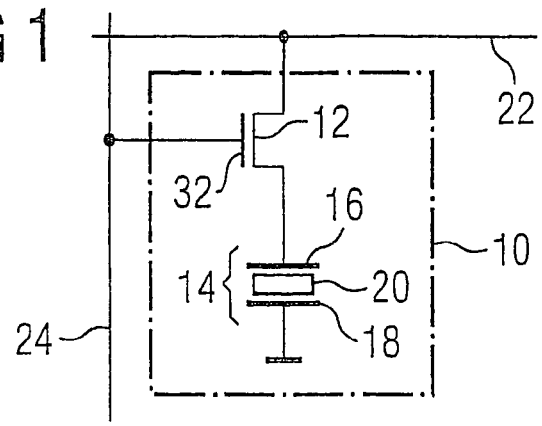
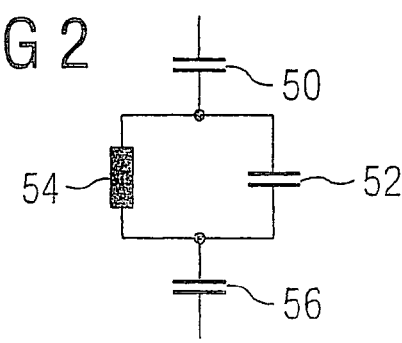
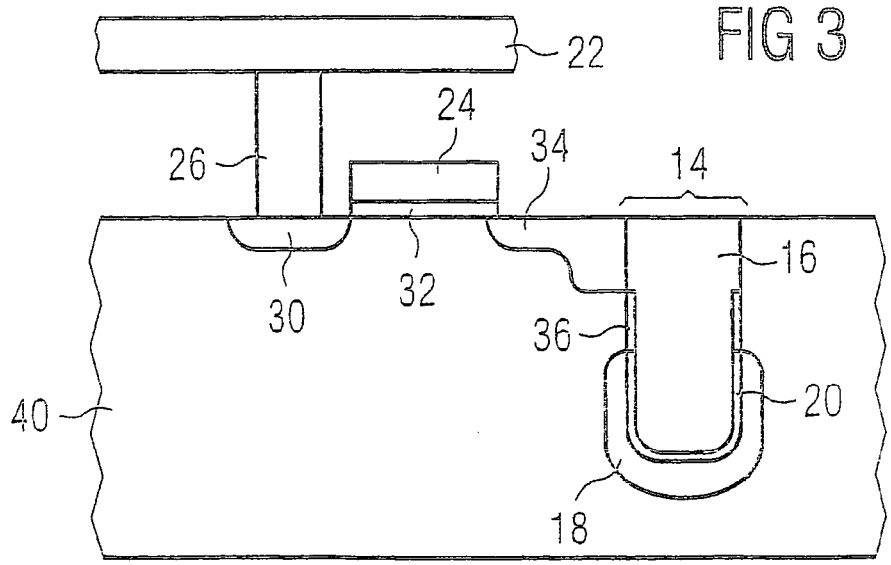

SEMICONDUCTOR STORAGE LOCATION

FIELD OF THE INVENTION

The invention relates to a semiconductor memory cell, in particular, in a DRAM memory cell array, having a selection transistor and a storage capacitor.

BACKGROUND

Memory cells of this type are used, for example, in dynamic random access memories (DRAMs). A DRAM chip contains a matrix of memory cells, which are arranged in the form of rows and columns and are addressed by word lines as control lines and bit lines as read-out lines. The read-out of data from the memory cells, or the writing of data to the memory cells, is realized by the activation of suitable word lines and bit lines.

Each of the memory cells contains a capacitor for the purpose of charge storage, the charge state in the capacitor representing a data bit. The memory cell usually further contains a transistor connected to a capacitor. The transistor has two diffusion regions separated from one another by a channel, which is controlled by a gate as a control terminal. Depending on the direction of the current flow, one diffusion region is designated as the drain and the other, as the source. The drain region is connected to the bit line, the source region is connected to the capacitor, and the gate is connected to the word line. By the application of suitable voltages to the gate, the transistor is controlled in such a way that a current flow between the drain region and the source region through the channel is switched on and off.

The charge stored in the capacitor decreases with time on account of leakage currents. Before the charge has decreased to an indeterminate level below a threshold value, the storage capacitor must be refreshed. For this reason, these memory cells are referred to as dynamic RAM (DRAM). Such a memory is discussed, for example, in the U.S. Pat. No. 5,867,420.

The central problem in the case of the known DRAM variants is that of producing a sufficiently large capacitance of the capacitor. This problem area will be aggravated in future by the advancing miniaturization of semiconductor components. The continuous increase in the integration density means that the area available per memory cell, and thus, the capacitance of the capacitor decrease ever further. An excessively small capacitance of the capacitor can adversely affect the functionality and usability of the memory device since an excessively small quantity of charge is stored on it.

By way of example, the sense amplifiers connected to the bit line require a sufficiently high signal level for a reliable read-out of the information held in the memory cell. The ratio of the storage capacitance to the bit line capacitance is crucial in determining the signal level. If the storage capacitance is too low, this ratio may be too small for the generation of an adequate signal.

A smaller storage capacitance likewise requires a higher refresh frequency since the quantity of charge stored in the capacitor is limited by its capacitance and additionally decreases due to leakage occurrence. If the quantity of charge in the storage capacitor falls below a minimum quantity of charge, then it is no longer possible to read out the information stored in it by the connected sense amplifiers; the information is lost and read errors occur.

According to a rule of thumb, the storage capacitance should be at least about 35 ff in order to obtain a sufficiently large read signal and sufficient insensitivity to alpha radiation. Using a dielectric, 10 nm thick, made of $SiO_2$, with a dielectric constant (DC) of $\epsilon_r=4$, requires a capacitor area of about 10 $\mu m^2$. However, even with a 4M DRAM, there is already less area than 10 $\mu m^2$ are available for the entire memory cell, thereby ruling out a purely planar arrangement of the capacitor.

It has therefore become necessary, in order to obtain sufficient storage capacitance for the capacitor layout, to utilize the third dimension, for example, by configuring the capacitor as a trench capacitor or stacked capacitor. With further miniaturization, the smaller area available can then be compensated for by means of an increase in the capacitance through the use of deeper trenches or higher stacks.

Another approach consists in using materials having a larger dielectric constant. By way of example, $Si_3N_4$ with a DC of 7 is used, in particular, in the form of ONO (oxide-nitride-oxide) and NO (nitride-oxide) sandwiches. In this case, a thermal oxide having a thickness of 2–3 nm is grown on the silicon, for example, in order to ensure a low interfacial state density. A silicon nitride layer having a thickness of 7–8 nm is then deposited and subsequently oxidized in order to obtain a second oxide layer having a thickness of 2–3 nm. This second oxide layer serves for preventing the tunneling of charge carriers by means of a high energy barrier.

Even the use of materials having an even higher DC, such as, for example, tantalum oxide ($Ta_2O_5$) or barium strontium titanate (BST), is possible although not unproblematic in terms of process engineering. With this possibility, the storage capacitance that can be achieved is upwardly limited by the dielectric constant and the thickness of the dielectric at which the latter still effects insulation.

SUMMARY

The invention, is based on the object of specifying a memory cell of a generic type whose storage capacitor has a high storage capacitance per area and thus enables a small structural form.

This object is achieved by the memory cell of claim 1. Preferred refinements emerge from the subclaims.

According to the invention, in a semiconductor memory cell a layer of a superionic conductor is arranged between a first and second capacitance electrodes of a storage capacitor.

The invention is thus based on the concept of providing a layer of a superionic conductor, instead of a dielectric, between two capacitor electrodes. While the superionic conductor has a high conductivity for ions, its electron conductivity can be so low that it practically blocks the electron DC current. On the other hand, owing to the high ion conductivity, the total capacitance of the capacitor is not determined by the bulk capacitance of the ionic conductor but rather by the interface capacitances between ionic conductor and capacitor electrodes. In this way, it is possible to produce extremely high capacitances in a small space.

It is preferable if the electron conductivity of the superionic conductor layer is negligibly small. In the present context, this means that the electron conductivity is so small that the ionic conductor layer acts as an insulator with regard to the electron DC current under the customary operating conditions of a semiconductor memory cell.

In one implementation, the superionic conductor layer includes a tysonite, in particular $(Ca, La, RE)F_3$. In this case, RE denotes a rare earth metal, that is to say an element from the group SC, Y, La, Ce, Fr, Nd, Pm, Sm, Eu, Gd, Tb, Dy, Ho, Er, Tm, Yb, and Lu. In this class of ionic conductors, fluorine ions are responsible for the charged transport.

In this case, the superionic conductor layer is preferably formed from doped $LaF_3$. Particularly good results are obtained in the case of heterovalent doping with $SrF_2$, the proportion of $SrF_2$ expediently being from 0.1 to 10% by weight. A proportion of from 1 to 5% by weight is preferred, and a proportion of about 2% by weight is especially preferred. As a result of the doping, the ion conductivity of $LaF_3$ can be increased again by a plurality of orders of magnitude.

The storage capacitor of the memory cell can be formed as a trench capacitor.

Alternatively, storage capacitor of the memory cell can be formed as a stacked capacitor.

Further variations, features and details of the invention emerge from the dependent claims, the description of the exemplary embodiments and the drawings.

BRIEF DESCRIPTION OF THE FIGURES.

The invention will be explained in more detail below using an exemplary embodiment in connection with the drawings. Only the elements which are essential for understanding the invention are illustrated in each case. In the figures, FIG. 1 shows a diagrammatic illustration of a memory cell of a memory cell array according to an exemplary embodiment of the invention;

FIG. 2 shows an equivalent circuit diagram for the storage capacitor of FIG. 1;

FIG. 3 shows a DRAM memory cell according to one embodiment of the invention.

DETAILED DESCRIPTION

FIG. 1 shows a memory cell 10 of a larger memory cell array. The memory cell 10 contains a selection transistor 12 and a storage capacitor 14. The first capacitor electrode 16 of the storage capacitor 14 is connected to the bit line 22 via the selection transistor 12, and the gate 32 of the selection transistor 12 is connected to the word line 24.

By the application of a corresponding voltage to the gate 32, the transistor 12 is turned on, and the charge stored in the capacitor 14 flows onto the bit line 22, where it causes a voltage level change which is amplified by a sense amplifier (not shown) assigned to the bit line 22, so that it is available for read-out. After the read-out operation, the information bit is written back to the capacitor 14 again.

A thin layer of a superionic conductor, in the exemplary embodiment, a thin layer 20 made of $LaF_3$ doped with 2% by weight of $SrF_2$, is arranged between the capacitor electrodes or capacitor contacts 16, 18. This layer 20 combines a high ion conductivity with a negligible electron conductivity.

In the exemplary embodiment, the thin layer is fabricated by coevaporation of $LaF_3$ and $SrF_2$ in vacuum at a pressure below $5\times10^{-6}$ mbar and a substrate temperature of about 500° C.

With this composition of the ionic conductor, even with a layer thickness of 240 nm a capacitance of 4 $nF/mm^2$ could already be achieved, which corresponds to an apparent dielectric constant of about 100.

The manifestation of the high capacitance of the capacitor 14 with superionic conductor layer 20 will now be explained in connection with the equivalent circuit diagram of FIG. 2.

In this case, the bulk capacitance 52 of the ionic conductor layer 20 and the interface capacitances 50 and 56 of the ionic conductor with respect to the metallic or semiconducting capacitor plates 16, 18 are influential as quantities to be taken into account. On account of the high ion conductivity, the capacitance 52 is practically bridged via the small resistor 54, so that the total capacitance is essentially determined only by the interface capacitances 50 and 56.

A concrete exemplary embodiment of a memory cell having a superionic conductor layer in a trench capacitor is shown in cross section in FIG. 3. In this case, doping regions 30, 34 are formed in the silicon substrate 40, the doping regions forming drain and source of the selection transistor 12. The gate 32 of the transistor is connected to the word line 24, which extends perpendicularly to the plane of the drawing in FIG. 3.

The bit line 22 is connected to the drain doping region 30 of the transistor via a contact 26. The source doping region 34 produces the connection to the trench capacitor 14.

One of the two capacitor electrodes is formed by a conductive trench filling 16, for example, made of doped poly-Si. The counter electrode is formed by the buried doping region 18, which is electrically connected via a buried well (not illustrated) to adjacent memory cells and a voltage source.

For the insulation of the doping regions 23 and 18, an insulation collar 36 is situated in the upper part of the trench.

Instead of the dielectric that is usually provided, in the exemplary embodiment, a superionic conductor layer 20 is arranged between the two capacitor electrodes 16, 18, the composition of which layer may correspond to that described above.

The high apparent dielectric constant of the material in connection with a small layer thickness and the configuration of the capacitor as a trench capacitor allows an extremely high capacitance to be produced in a very small space and thus a memory cell to be produced which can be miniaturized within a wide range.

The invention claimed is:

1. An integrated semiconductor memory cell in a DRAM memory cell array, comprising:
    a selection transistor including a control terminal coupled to a control line; and
    a storage capacitor formed as a trench capacitor in a semiconductor substrate, the storage capacitor including:
        a first capacitor electrode coupled to a read-out line via the selection transistor, a second capacitor electrode comprising a buried doping region in the semiconductor substrate, and
        a layer arranged between the first and second capacitor electrodes of the storage capacitor, the layer being formed from doped $LaF_3$ and disposed on the buried doping region.

2. The semiconductor memory cell as claimed in claim 1, wherein the layer is doped with $SrF_2$.

3. The semiconductor memory cell as claimed in claim 1, wherein the layer is doped with 0.1 to 10% by weight of $SrF_2$.

4. The semiconductor memory cell as claimed in claim 3, wherein the layer is doped with 1 to 5% by weight of $SrF_2$.

5. The semiconductor memory cell as claimed in claim 4, wherein the layer is doped with approximately 2% by weight of $SrF_2$.

6. The semiconductor memory cell as claimed in claim 2, wherein the layer is doped with 0.1 to 10% by weight of $SrF_2$.

7. The semiconductor memory cell as claimed in claim 6, wherein the layer is doped with 1 to 5% by weight of $SrF_2$.

8. The semiconductor memory cell as claimed in claim 7, wherein the layer is doped with approximately 2% by weight of $SrF_2$.

* * * * *